US010881013B1

(12) United States Patent
Marker

(10) Patent No.: US 10,881,013 B1
(45) Date of Patent: Dec. 29, 2020

(54) ANTI-LIGATURE COVER FOR WALL-MOUNTED ELECTRICAL DEVICES

(71) Applicant: Thomas M. Marker, Howell, NJ (US)

(72) Inventor: Thomas M. Marker, Howell, NJ (US)

( * ) Notice: Subject to any disclaimer, the term of this patent is extended or adjusted under 35 U.S.C. 154(b) by 130 days.

(21) Appl. No.: 16/164,843

(22) Filed: Oct. 19, 2018

(51) Int. Cl.
*H05K 5/03* (2006.01)
*H02G 3/08* (2006.01)
*H01H 9/02* (2006.01)
*H01R 13/502* (2006.01)
*F21V 15/01* (2006.01)

(52) U.S. Cl.
CPC ............... *H05K 5/03* (2013.01); *F21V 15/01* (2013.01); *H01H 9/02* (2013.01); *H01R 13/502* (2013.01); *H02G 3/081* (2013.01)

(58) Field of Classification Search
CPC combination set(s) only.
See application file for complete search history.

(56) References Cited

U.S. PATENT DOCUMENTS

| | | | | |
|---|---|---|---|---|
| 1,938,303 A * | 12/1933 | Tregoning | ............ | H01R 24/28 439/472 |
| 2,380,151 A * | 7/1945 | David | .................... | H01R 24/58 439/535 |
| 2,427,349 A * | 9/1947 | Boynton | ............. | H01R 13/631 439/536 |
| 2,764,429 A * | 9/1956 | Betzler | ................ | H01R 13/748 285/189 |
| 2,880,264 A * | 3/1959 | Ruskin | ..................... | H02G 3/14 174/67 |
| 3,432,611 A * | 3/1969 | Gaines | ................... | H02G 3/121 174/66 |
| 3,491,327 A * | 1/1970 | Goldwater, Jr. | ......... | H02G 3/14 439/135 |
| 3,601,757 A * | 8/1971 | Gober | ................ | H01R 13/6395 439/147 |
| 3,960,427 A * | 6/1976 | Piaget | ..................... | H01R 4/70 439/147 |
| 4,070,078 A * | 1/1978 | Chrones | ............... | H01R 13/447 174/67 |
| 4,083,618 A * | 4/1978 | Busch, Jr. | .......... | H01R 13/6395 174/67 |
| 4,500,746 A * | 2/1985 | Meehan | ................... | H02G 3/12 174/503 |
| 4,586,765 A * | 5/1986 | Ban | ...................... | H01R 13/447 439/133 |
| 4,605,817 A * | 8/1986 | Lopez | ............... | H01R 13/6395 174/67 |
| 4,740,655 A * | 4/1988 | Ford | .................... | H01R 13/447 174/67 |

(Continued)

*Primary Examiner* — Binh B Tran
*Assistant Examiner* — Krystal Robinson
(74) *Attorney, Agent, or Firm* — Hanrahan Law Firm P.A.; Benjamin M. Hanrahan

(57) ABSTRACT

An anti-ligature cover for electrical devices, such as outlets, switches, emergency signs, exit signs, and junction boxes is presented herein. In particular, the cover is structured to house or cover a standard surface-mounted or wall-mounted electrical device commonly found in institutions, hospitals and prisons. The cover includes a top face that is sloped in a downward direction from the rear base toward the front surface. The downward sloped configuration prevents or restricts retention of a loop or ligature thereon.

14 Claims, 5 Drawing Sheets

(56) References Cited

U.S. PATENT DOCUMENTS

| | | | | |
|---|---|---|---|---|
| 4,803,307 A * | 2/1989 | Shotey | H02G 3/088 | 174/67 |
| 4,895,527 A * | 1/1990 | Brown | H01R 13/447 | 439/147 |
| 4,895,999 A * | 1/1990 | Calderon | H01R 13/447 | 174/67 |
| 5,045,640 A * | 9/1991 | Riceman | H01R 13/447 | 174/67 |
| 5,080,598 A * | 1/1992 | Shotey | H01R 13/5213 | 174/67 |
| 5,087,796 A * | 2/1992 | Norman | H02G 3/14 | 174/67 |
| 5,174,773 A * | 12/1992 | Jones | H01R 13/447 | 174/67 |
| 5,195,901 A * | 3/1993 | Correnti | H01R 13/447 | 174/67 |
| 5,243,135 A * | 9/1993 | Shotey | H02G 3/14 | 174/67 |
| D342,235 S * | 12/1993 | Shotey | D13/156 | |
| 5,280,135 A * | 1/1994 | Berlin | H02G 3/14 | 174/67 |
| D354,736 S * | 1/1995 | Hallett | D13/156 | |
| 5,382,755 A * | 1/1995 | Correnti | H01R 13/447 | 174/67 |
| 5,594,208 A * | 1/1997 | Cancellieri | H02G 3/10 | 174/58 |
| 5,645,449 A * | 7/1997 | Sabo | G02B 6/4466 | 439/536 |
| D417,656 S * | 12/1999 | Billhimer | D13/156 | |
| 6,028,268 A * | 2/2000 | Stark | H02B 1/50 | 174/67 |
| D448,649 S * | 10/2001 | Billhimer | D13/177 | |
| D465,461 S * | 11/2002 | Hinshaw | D13/177 | |
| D471,160 S * | 3/2003 | Mason | D13/156 | |
| 6,723,922 B1 * | 4/2004 | Shotey | H02G 3/14 | 174/66 |
| 7,056,145 B2 * | 6/2006 | Campbell, III | H01R 13/6395 | 174/67 |
| 7,304,237 B1 * | 12/2007 | Shotey | H02G 3/14 | 174/66 |
| 7,378,591 B2 * | 5/2008 | Dinh | H02G 3/086 | 174/50 |
| 7,381,894 B1 * | 6/2008 | Shotey | H02G 3/14 | 174/66 |
| 7,396,996 B1 * | 7/2008 | Shotey | H02G 3/14 | 174/67 |
| 8,558,111 B1 * | 10/2013 | Baldwin | H02G 3/088 | 174/67 |
| 10,276,979 B2 * | 4/2019 | Cyzen | H01R 31/06 | |
| 10,389,098 B2 * | 8/2019 | Shotey | H01R 25/006 | |
| 10,637,223 B2 * | 4/2020 | Newill | H02G 3/125 | |
| 2006/0160384 A1 * | 7/2006 | Brazina | H01R 13/447 | 439/136 |
| 2008/0289846 A1 * | 11/2008 | Wimberly | H02G 3/14 | 174/67 |
| 2017/0268213 A1 * | 9/2017 | deLoache, III | A47K 13/26 | |

\* cited by examiner

ANTI-LIGATURE COVER FOR WALL-MOUNTED ELECTRICAL DEVICES

FIELD OF THE INVENTION

The present invention is generally directed to a cover for electrical devices. In particular, the invention of at least one embodiment is directed to an anti-ligature cover for standard surface-mounted or wall-mounted electrical devices, such as, but not limited to, outlets, switches, junction boxes, emergency lights, exit lights, and the like.

BACKGROUND OF THE INVENTION

Many institutions, including but in no way limited to prisons, correctional facilities, jails, hospitals, medical hospitals, psychiatric hospitals, mental health units, etc. include or are otherwise at least partially built with walls made of concrete block, or other like hard surfaces. For this, and perhaps other reasons, many of the electrical devices, such as outlets, switches, junction boxes, emergency lights, exit lights, etc., are surface-mounted or wall-mounted devices in that they are not fully recessed within the wall. This can, in some cases, create a hazardous location or surface upon which a ligature or loop can be retained, thereby resulting in injury or possibly even death to a patient, inmate or other individual within the institution.

There is thus a need for an anti-ligature cover that can prevent or restrict use of the cover as a support for a ligature, loop or other like hazardous device. The proposed anti-ligature cover can replace the existing electrical (or other) covers on switches, outlets, and junction boxes mounted on the walls in institutions and elsewhere to considerably reduce the risk of harm described above.

In particular, the proposed cover would include a sloped top surface extending or spanning from the rear surface toward the front surface such that attempts to secure or retain a loop or ligature thereon would result in the loop or ligature sliding down the sloped surface and off of the cover over the front surface. This would restrict, minimize or possibly prevent use of the cover as a support for a hazardous ligature.

SUMMARY OF THE INVENTION

Accordingly, the present invention is directed to an anti-ligature cover that can be used to cover or house one or more electrical devices, such as outlets, switches, junction boxes, etc. in institutions and elsewhere. The covers can be constructed of one or more various plastic materials, such as a thermoformed plastic, although other materials are contemplated and can be used within the full spirit and scope of the present invention.

In particular, the cover of the various embodiments disclosed herein includes a downward sloped top surface or top face extending from the rear to the front of the cover. The downward sloped surface restricts or prevents retention of a loop or ligature thereon In the case of an emergency light or exit sign, the cover can be constructed of shatter proof plastic or other material, and bolt or mount to the wall or ceiling around the fixture, while still allowing the sign or fixture to be seen there through. This can also prevent the sign, wall or ceiling from potential damage.

Other embodiments may include anti-ligature toilet roll holders, door hinges, or other products, with a sloped, anti-ligature top surface.

These and other objects, features and advantages of the present invention will become more apparent when the drawings as well as the detailed description are taken into consideration.

BRIEF DESCRIPTION OF THE DRAWINGS

Like reference numerals refer to like parts throughout the several views of the drawings provided herein.

DETAILED DESCRIPTION OF THE INVENTION

Figure 1:
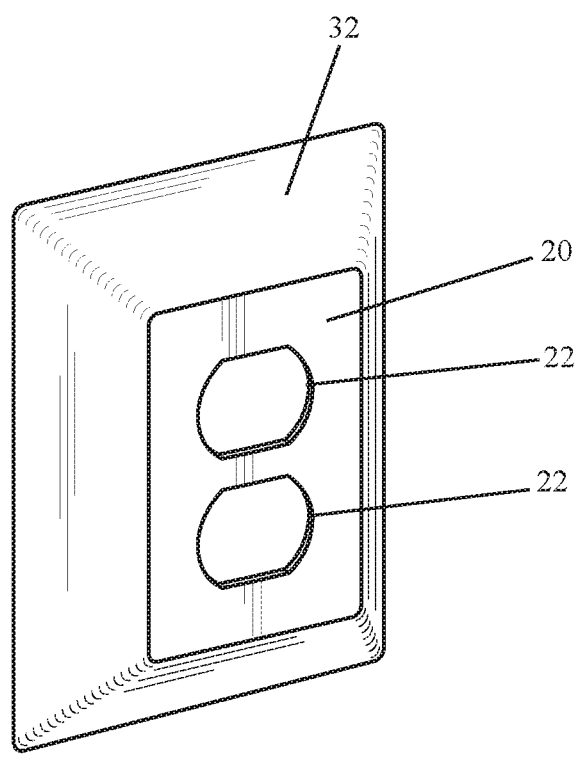
FIG. 1 is a perspective view of the anti-ligature cover as disclosed in accordance with at least one embodiment of the present invention.

As shown in the accompanying drawings, and with particular reference to FIG. 1, for example, the present invention is directed to an anti-ligature cover, generally referenced as 10, for covering an electrical device. Specifically, at least one embodiment of the present invention is directed to a cover 10 that restricts or prevents retention of a ligature or loop on a top surface thereof. In this manner, as will be described herein, at least the top surface of the cover 10 of at least one embodiment of the present invention comprises a sloped configuration or sloped orientation, particularly when the cover 10 is placed up against a wall in a covering relation to an electrical device.

It should also be noted that while FIG. 1 represents a cover 10 for an electrical outlet with openings through which a plug can engage the covered outlet, other embodiments of the present invention include a cover 10 for covering or retaining switches, junction boxes, emergency lights, exit lights, and the like.

Furthermore, many institutions, such as prisons, correctional facilities, jails, hospitals, medical hospitals, psychiatric hospitals, mental health units, etc. include or are otherwise at least partially built with walls made of concrete block, or other hard surfaces. For this, and perhaps other reasons, many of the electrical devices, such as outlets, switches, junction boxes, emergency lights, exit lights, etc., are surface-mounted or wall-mounted devices in that they are not fully recessed within the wall. This can, in some cases, create a location or surface upon which a ligature or loop can be retained, thereby resulting in injury or possibly even death to a patient, inmate or other individual within the institution.

Figure 2:
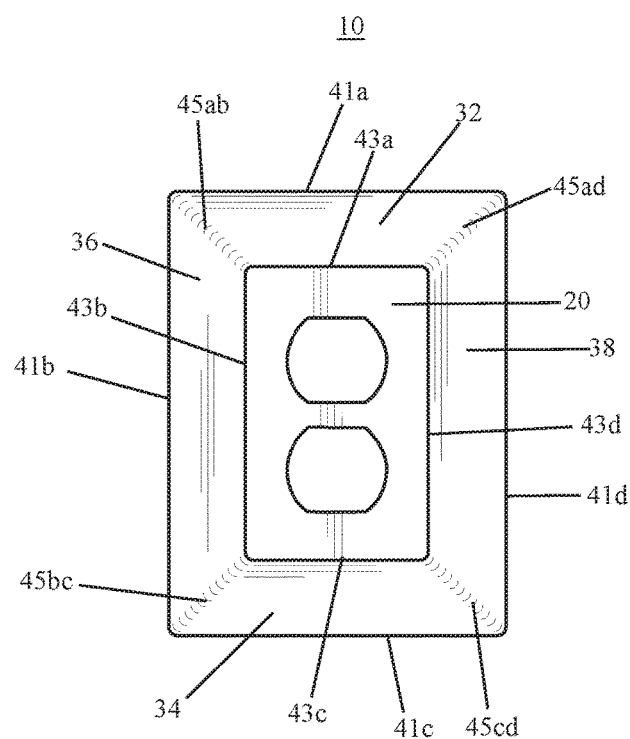
FIG. 2 is a front view of the anti-ligature cover as disclosed in accordance with at least one embodiment of the present invention.
Figure 3:
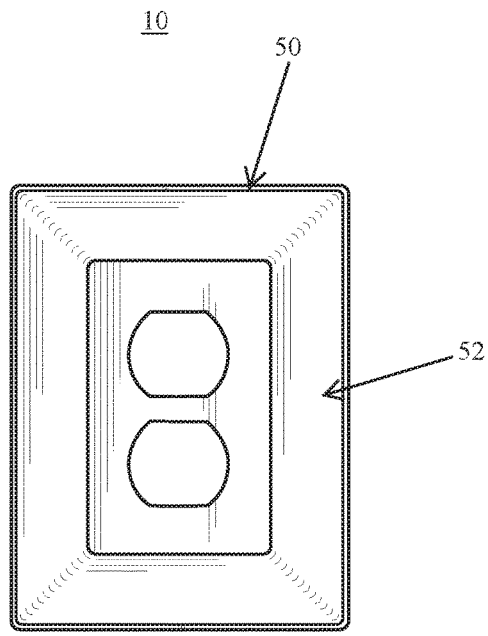
FIG. 3 is a rear view of the anti-ligature cover as disclosed in accordance with at least one embodiment of the present invention.

As described in accordance with at least one embodiment herein, the present invention is directed to a cover that can cover the wall-mounted or surface-mounted electrical device(s) while restricting or preventing a loop or ligature from being retained thereupon. Specifically, as shown in FIG. 2, the cover 10 of at least one embodiment includes a font surface 20 and a plurality of lateral faces, including for example, a top face 32, bottom face 34, left face 36 and right face 38. In addition, as represented in FIG. 3, the cover 10 of at least one embodiment includes an at least partially open rear base 50 leading into an open interior portion 52. The dimensions of the interior portion 52, defined by the various surfaces and faces of the cover 10 is sufficient to house or cover surface-mounted or wall-mounted electrical devices, not shown.

Figure 7:
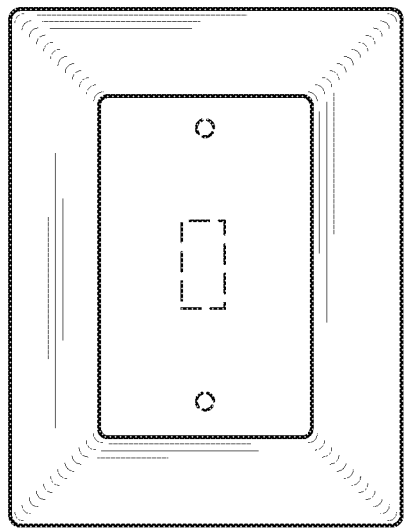
FIG. 7 is a front view of another embodiment or configuration of the anti-ligature cover as disclosed herein.
Figure 8:
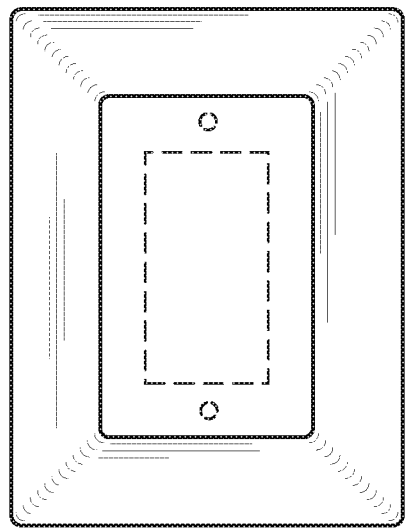
FIG. 8 is a front view of another embodiment or configuration of the anti-ligature cover as disclosed herein.
Figure 9:
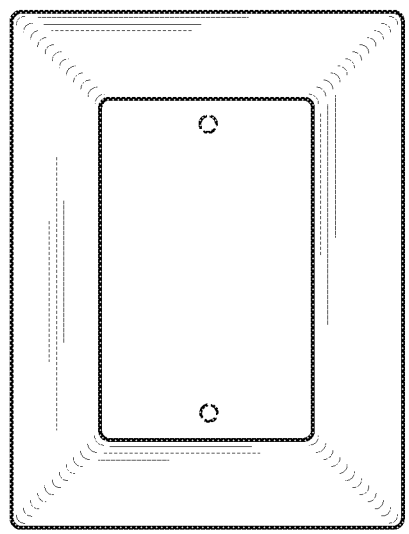
FIG. 9 is a front view of yet another embodiment or configuration of the anti-ligature cover as disclosed herein.

In some embodiments, the front surface 20 includes one or more openings 22 through which a portion of the electrical device can extend or be accessed. For example, in the embodiment illustrated in FIGS. 2 and 3, the cover 10 and in particular the front surface 20 includes two openings sized to receive two correspondingly configured electrical outlets, not shown. Other embodiment may include one or more openings 22 to receive or allow access to an electrical switch (e.g., FIGS. 7 and 8). Other embodiments many not need an opening (e.g., FIG. 9). Other configurations are contemplated within the full spirit and scope of the present invention, which may depend on the type, size or configuration of the particular electrical device of which the cover 10 pertains.

Moreover, the top face 32 of the various embodiments, and in some cases, all of the lateral faces 32, 34, 36, 38 include a downward sloped configuration. In this manner, retention of a loop or ligature on the top face 32 is restricted or prevented. The downward slope begins at the top edge or rear edge 41a of the top face and continues along the entire or substantially the entire top surface 32 until front edge 43a of the top face 32.

Accordingly, in at least one embodiment, the top surface 32, defined as the surface between rear edge 41a and front edge 43a, comprises a continuously sloped surface or configuration and does not include any flat or substantially flat surfaces, valleys, or areas upon which or within which a string, rope, or other like instrument may be retained or supported.

Figure 5A:
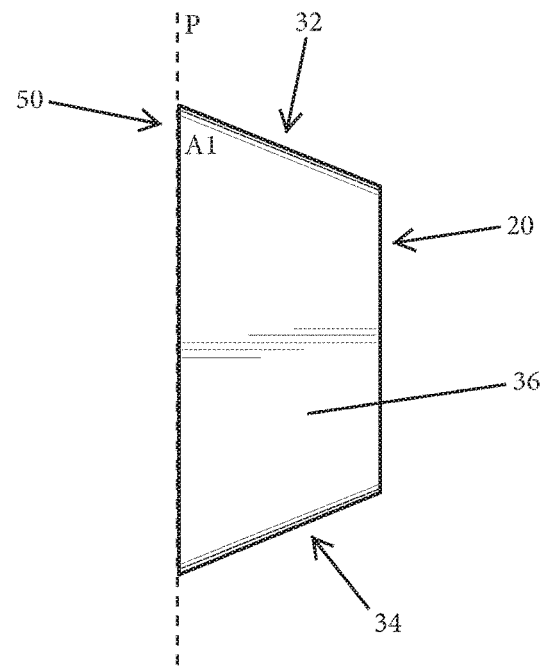
FIG. 5a is a left-side view of the anti-ligature cover as disclosed in accordance with at least one embodiment of the present invention.
Figure 5B:
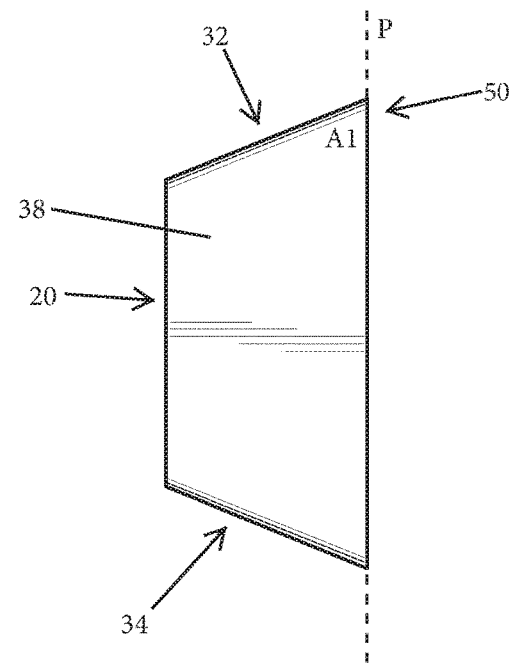
FIG. 5b is a right-side view of the anti-ligature cover as disclosed in accordance with at least one embodiment of the present invention.

With reference now to FIGS. 5a and 5b, the rear base, shown as 50, is aligned with a vertical plane P. The vertical plane P is generally representative of the wall upon which the cover 10 will be secured or attached, although it should be noted that not all walls will be perfectly vertical. In any event, when the rear base 50 is aligned with a vertical plane, as shown in FIGS. 5a and 5b, the top face 32 is disposed at a downward angle A1 from the rear base 50 toward the front surface 20. As illustrated, the sloped surface of the top face 32 is continuous and uniform from the rear base 50 all the way to the front surface 20. There are no flat surfaces, dips, or other like areas upon which a ligature or loop can be retained. Also, there is no upward or outward lip at the edge 43a between the top face 32 and the front surface 20. Rather, the edge 43a is a smooth downward transition between the top face 32 and the front surface 20.

Figure 4A:
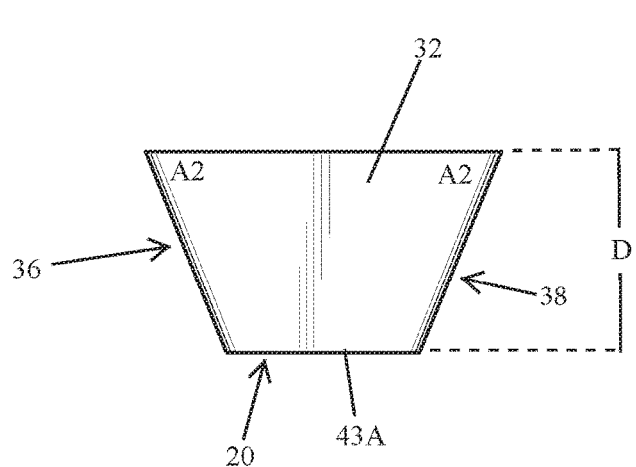
FIG. 4a is a top view of the anti-ligature cover as disclosed in accordance with at least one embodiment of the present invention.
Figure 4B:
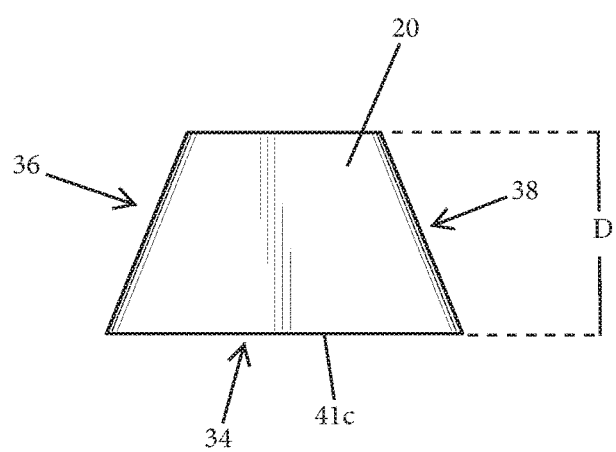
FIG. 4b is a bottom view of the anti-ligature cover as disclosed in accordance with at least one embodiment of the present invention.

Furthermore, the downward sloping top surface 32 creates a downward angle A1, as shown in FIGS. 5a and 5b. This angle A1, in some embodiments is between approximately 60° and 70° from the vertical plane P. In some implementations, angle A1 may be approximately 68°, although other angles and dimensions larger than 70° and smaller than 60° is contemplated within the full spirit and scope of the present invention. Furthermore, with reference to the top view of FIG. 4a and the corresponding bottom view of FIG. 4b, the side faces 36, 38 may also be angularly configured or oriented relative to the rear base 50 or a horizontal plane aligned with the rear base 50. As an example, the angle A2 in FIGS. 4a and 4b may also be between approximately 60° and 70°, or approximately 68°. Of course, A2 may be larger than 70° and smaller than 60°.

In addition, as noted above, many embodiments of the present invention are designed to cover wall-mounted or surface-mounted electrical devices. In this manner, the cover 10 includes a depth D defined as the distance between the front surface 32 and the rear base 50, that is deep enough to at least partially house or retain a wall-mounted or surface-mounted electrical device therein. In some embodiments, the depth D is between 2.5 inches and 3.5 inches, such as approximately 3.0 inches, although other dimensions and depths D are contemplated within the fill spirit and scope of the present invention.

It should also be noted that in some embodiments, all of the faces, such as the top face 32, bottom face 34, and side faces 36, 38 are angled such that the cover tapers inward from the rear base 50 toward the front face 20 on all sides. In this manner, each of the lateral faces 32, 34, 36, 38 of at least one embodiment may include a trapezoidal configuration or shape, as illustrated in the embodiment shown in FIGS. 2 through 5b. Each of the lateral faces thus include a rear edge (represented as 41a-d) and a front edge (represented as 43a-d). Furthermore, each of the lateral faces 32, 34, 36, 38 of at least one embodiment include angled side edges (45ad, 45bc, 45cd, 45ad) spanning between the corresponding rear edge 41a-d and front edge 43a-d.

In this manner the cover 10 of at least one embodiment is configured to represent a truncated pyramid, although rotated 90 degrees, with the bottom of the pyramid represented by the at least partially open rear base 50 and the truncated top portion of the pyramid represented by the front surface 20.

Figure 6:
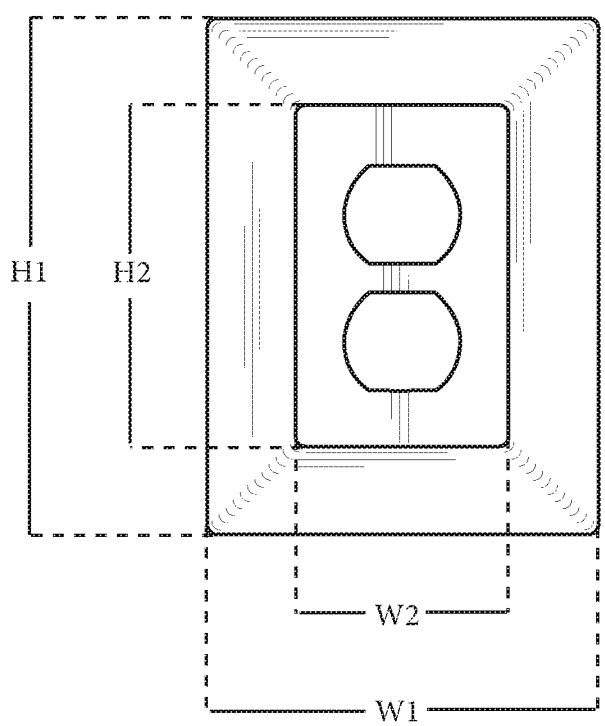
FIG. 6 is another front view of the anti-ligature cover as disclosed in accordance with at least one embodiment of the present invention.

Accordingly, the front surface 20 includes an area with a perimeter defined by the front edges 43a-d. Similarly, the rear base 50 includes an area with a perimeter defined by the rear edges 41a-d. As illustrated, the area of the front face 20 is smaller than the area of the rear base 50. Particularly, as represented FIG. 6, the rear base includes a width W1 and height H1, whereas the front face 20 includes a width W2 and height H2. In just one example, the width W1 may be between approximately 5.0 and 5.5 inches, such as approximately 5.326 inches, the width W2 may be between approximately 2.5 and 3.0 inches, such as approximately 2.9 inches, the height H1 may be between 6.75 and 7.25 inches, such as approximately 7.042 inches, and the height H2 may be between approximately 4.5 and 5.0 inches, such as approximately 4.640 inches. Other dimensions and sizes are contemplated within the full spirit and scope of the present invention.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention. This written description provides an illustrative explanation and/or account of the present invention. It may be possible to deliver equivalent benefits using variations of the specific embodiments, without departing from the inventive concept. This description and these drawings, therefore, are to be regarded as illustrative and not restrictive.

Now that the invention has been described,

What is claimed is:

1. An anti-ligature electrical cover, comprising,
a front surface, an at least partially open rear base, and a plurality of lateral faces, said plurality of lateral faces comprising a top face, a bottom face, and two side faces,
wherein each of said plurality of lateral faces comprise a trapezoidal configuration spanning between said front surface and said at least partially open rear base, each of said plurality of lateral faces being defined by a rear edge, a front edge, and two angled side edges spanning between said rear edge and said front edge,
wherein said at least partially open rear base is aligned with a vertical plane, said top face is angled downward from said at least partially open rear base toward said front surface,
wherein, when said at least partially open rear base is aligned with the vertical plane, said top face defines a downward angle with the vertical plane of between approximately 60 degrees and 70 degrees,
wherein said front surface of said anti-ligature electrical cover comprises at least one electrical opening, and
wherein said front surface comprises a first area with a perimeter defined by said front edges of said plurality of lateral faces, and said at least partially open rear base comprises a second area with a perimeter defined by said rear edges of said plurality of lateral faces, said first area being smaller than said second area.

2. The anti-ligature electrical cover as recited in claim 1 at least substantially defining a truncated pyramid.

3. The anti-ligature electrical cover as recited in claim 1 wherein said downward angle of said top face is approximately 68°.

4. The anti-ligature-electrical cover as recited in claim 3 further comprising a distance between said rear edge of said top face and said front edge of said top face as being between approximately 2.5 and 3.5 inches.

5. The anti-ligature electrical cover as recited in claim 4 wherein said distance between said rear edge of said top face and said front edge of said top face as being approximately 3.0 inches.

6. An anti-ligature electrical cover for a surface-mounted electrical fixture, said anti-ligature electrical cover comprising,
a front surface, an at least partially open rear base, a top face, a bottom face, at least two side faces, and an at least partially open interior portion, said at least partially open interior portion being structured to at least partially enclose the surface-mounted electrical fixture,
wherein said front surface of said anti-ligature electrical cover comprises at least one electrical opening,
wherein, when said at least partially open rear base is aligned with a vertical plane, said top face is angled downward from said at least partially open rear base toward said front base in order to restrict retention of a ligature thereon,
wherein, when said at least partially open rear base is aligned with the vertical plane, said top face defines a downward angle with the vertical plane of between approximately 60 degrees and 70 degrees.

7. The anti-ligature electrical cover as recited in claim 6 wherein said downward angle of said top face is approximately 68°.

8. The anti-ligature-electrical cover as recited in claim 7 further comprising a distance between a rear edge of said top face and a front edge of said top face as being between approximately 2.5 and 3.5 inches.

9. The anti-ligature electrical cover as recited in claim 8 wherein said distance between said rear edge of said top face and said front edge of said top face as being approximately 3.0 inches.

10. The anti-ligature electrical cover as recited in claim 9 wherein said top face, said bottom face, and said at least two side faces each comprise a trapezoidal configuration spanning between said front base and said at least partially open rear base.

11. The anti-ligature electrical cover as recited in claim 10 wherein said front surface comprises a first area and said at least partially open rear base comprises a second area, said first area being smaller than said second area.

12. The anti-ligature electrical cover as recited in claim 11 at least substantially defining a truncated pyramid.

13. An anti-ligature electrical cover for a surface-mounted electrical fixture, said anti-ligature electrical cover comprising,
a front surface, an at least partially open rear base, a top face, a bottom face, at least two side faces, and an at least partially open interior portion, said at least partially open interior portion being structured to at least partially enclose the surface-mounted electrical fixture,
wherein, when said at least partially open rear base is aligned with a vertical plane, said top face is angled downward from said at least partially open rear base toward said front base in order to restrict retention of a ligature thereon,
wherein, when said at least partially open rear base is aligned with the vertical plane, said top face defines a downward angle with the vertical plane of between approximately 60 degrees and 70 degrees.

14. The anti-ligature electrical cover as recited in claim 13 wherein said distance between said rear edge of said top face and said front edge of said top face as being approximately 3.0 inches.

* * * * *